(12) United States Patent
Sato et al.

(10) Patent No.: US 9,447,879 B2
(45) Date of Patent: Sep. 20, 2016

(54) PISTON RING

(71) Applicant: KABUSHIKI KAISHA RIKEN, Tokyo (JP)

(72) Inventors: Masayuki Sato, Kashiwazaki (JP); Yuuichi Murayama, Kashiwazaki (JP); Youhei Iwamoto, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 0 days.

(21) Appl. No.: 14/650,115

(22) PCT Filed: Dec. 6, 2013

(86) PCT No.: PCT/JP2013/082830
§ 371 (c)(1),
(2) Date: Jun. 5, 2015

(87) PCT Pub. No.: WO2014/088096
PCT Pub. Date: Jun. 12, 2014

(65) Prior Publication Data
US 2015/0308573 A1    Oct. 29, 2015

(30) Foreign Application Priority Data

Dec. 7, 2012 (JP) ................................ 2012-268041

(51) Int. Cl.
*F16J 9/26* (2006.01)
*F02F 5/00* (2006.01)
(Continued)

(52) U.S. Cl.
CPC .............. *F16J 9/26* (2013.01); *C23C 14/0641* (2013.01); *C23C 14/325* (2013.01); *C23C 28/042* (2013.01); *C23C 28/044* (2013.01); *C23C 28/42* (2013.01); *F02F 5/00* (2013.01)

(58) Field of Classification Search
CPC ................... F16J 9/00; F16J 9/12; F16J 9/26
See application file for complete search history.

(56) References Cited

U.S. PATENT DOCUMENTS 6,325,385 B1 * 12/2001 Iwashita .................... F16J 9/26
                                                                                    277/442
8,273,469 B2     9/2012 Hoppe et al.
(Continued)

FOREIGN PATENT DOCUMENTS

JP    62188857 A  *  8/1987
JP    8-312779 A     11/1996
(Continued)

OTHER PUBLICATIONS

Ichimura et al., "Hardness and Adhesion of Arc-Ion Plated Nitride Films", Surface Technology, 2001, vol. 52, No. 1, pp. 110-115.
(Continued)

*Primary Examiner* — Gilbert Lee
(74) *Attorney, Agent, or Firm* — Birch, Stewart, Kolasch & Birch, LLP

(57) ABSTRACT

To provide a piston ring having a hard laminate coating for excellent scuffing resistance, wear resistance and peeling resistance, which can be used in an environment of high mechanical and thermal load in engines, the piston ring is provided with a hard laminate coating as thick as 10-60 μm on its outer peripheral surface, the laminate coating being formed by alternately laminating two types or more of layers made of different compounds, each of the compound layers being made of nitride of at least one metal selected from the group consisting of Ti, Cr, Zr, V, Hf and Al.

7 Claims, 2 Drawing Sheets

(51) Int. Cl.
  *C23C 14/06* (2006.01)
  *C23C 14/32* (2006.01)
  *C23C 28/04* (2006.01)
  *C23C 28/00* (2006.01)

(56) References Cited

U.S. PATENT DOCUMENTS

| | | | |
|---|---|---|---|
| 2004/0067384 A1* | 4/2004 | Hotger | F01B 17/04 428/591 |
| 2005/0218603 A1* | 10/2005 | Fischer | F16J 9/26 277/443 |
| 2008/0070815 A1* | 3/2008 | Kamada | C10M 169/04 508/107 |
| 2010/0171272 A1 | 7/2010 | Hoppe et al. | |
| 2013/0168906 A1* | 7/2013 | Kennedy | C23C 30/005 267/1.5 |
| 2014/0137733 A1* | 5/2014 | Sekiya | C23C 14/0641 92/172 |

FOREIGN PATENT DOCUMENTS

| | | |
|---|---|---|
| JP | 11-335813 A | 12/1999 |
| JP | 2000-274531 A | 10/2000 |
| JP | 2002-3976 A | 1/2002 |
| JP | 2005-60810 A | 3/2005 |
| JP | 2005-82822 A | 3/2005 |
| JP | 2005/187859 A | 7/2005 |
| JP | 2007-132423 A | 5/2007 |
| JP | 2007-278314 A | 10/2007 |
| JP | 2010-529389 A | 8/2010 |

OTHER PUBLICATIONS

International Search Report, issued in PCT/JP2013/082830, dated Jan. 14, 2014.

Oki, "Surface Hardening by Dry Process and Its Trend", Surface Technology, 1990, vol. 41, No. 5, pp. 462-470.

Written Opinion of the International Searching Authority, issued in PCT/JP2013/082830, dated Jan. 14, 2014.

* cited by examiner

PISTON RING

FIELD OF THE INVENTION

The present invention relates to a piston ring for automobile engines, particularly to a piston ring having hard laminate coating formed by ion plating for excellent scuffing resistance, wear resistance and peeling resistance.

BACKGROUND OF THE INVENTION

Piston rings have recently become used in increasingly severer environment, due to higher power of engines, higher combustion temperatures and larger load for meeting exhaust gas regulations, the use of low-viscosity lubricating oils, the diversification of fuels such as bioethanol, higher fuel injection pressure, etc. Even piston rings having hard chromium nitride (CrN) coatings formed by ion plating, which are now considered as having best scuffing resistance and wear resistance, may fail to exhibit sufficient performance due to the peeling of coatings by cracking and chipping. Accordingly, improvement in scuffing resistance, wear resistance and peeling resistance has been more strongly demanded than even.

Because the chromium nitride formed by ion plating generally suffers chipping despite hardness, various improvements such as the controlling of crystal orientations, structures and porosity, the addition of a third element, the lamination of coatings, etc., have been made so far.

With respect to the lamination of coatings, for example, Patent Reference 1 discloses a coating obtained by alternately laminating a columnar layer of CrN crystals oriented in a direction from a substrate surface to a coating surface, and a flat layer, or a coating obtained by alternately laminating a layer having porosity of 0-0.5% by volume and a layer having porosity of 1.5-20% by volume, to prevent the peeling of the coating due to chipping caused by chipping fatigue on an outer peripheral surface. For the same purpose, Patent Reference 2 discloses a thick, hard coating with reduced internal stress and high adhesion, which alternately comprises hard composite nitride layers of columnar crystals (for example, CrSiN and TiSiN), and non-columnar crystal layers relaxing the stress of the hard composite nitride layers, by alternately repeating high bias voltage conditions for forming columnar crystals and low bias voltage conditions for forming non-columnar crystals with constant intervals.

Patent References 1 and 2 disclose laminate coatings of nitrides having different structures (columnar structure and non-columnar structure, or porous structure and dense structure), and Patent Reference 3 discloses a different-composition laminate coating comprising metal layers as the stress-relaxing layers in Patent Reference 2. Though the metal layers relax stress more than the composite nitride layers of Patent Reference 2, they have an adverse effect on scuffing resistance.

Patent Reference 4 discloses a piston ring having a laminate coating formed by alternately laminating compound layers of titanium, carbon and nitrogen, and compound layers of chromium, carbon and nitrogen. To form a coating exhibiting excellent wear resistance without chipping when used for top rings of diesel engines, Patent Reference 4 determines the amount of carbon dissolved in a solid solution and porosity, such that the hard coating has fracture toughness of about 3 MPa·m$^{1/2}$ or more, and hardness Hv of 1700 or more.

However, the above laminate coatings are not satisfactory for some piston rings used in extremely severe environment, failing to avoid peeling due to cracking and chipping by the fatigue of the hard coatings.

PRIOR ART REFERENCES

Patent Reference

Patent Reference 1: JP 8-312779 A
Patent Reference 2: JP 2005-187859 A
Patent Reference 3: JP 2005-82822 A
Patent Reference 4: JP 2007-278314 A

Non-Patent Reference

Non-Patent Reference 1: Takeshi Oki, Surface Technology, Vol. 41, No. 5, 1990, pp. 462-470.
Non-Patent Reference 2: Hiroshi Ichimura, Yoshio Ishii, Surface Technology, Vol. 52, No. 1, 2001, pp. 110-115.

Object of the Invention

An object of the present invention is to provide a piston ring having a hard laminate coating formed by ion plating for excellent scuffing resistance, wear resistance and peeling resistance, which can be used in an environment under high mechanical and thermal load in engines.

SUMMARY OF THE INVENTION

The inventors have investigated the influence of fracture toughness, hardness and residual stress, as well as the properties of materials constituting the coating, such as Young's modulus and thermal conductivity, etc. on mechanical stress and thermal stress applied to a hard coating formed on a piston ring by ion plating. As a result, the inventors have found that by laminating a compound having high Young's modulus and thermal conductivity and a compound such as chromium nitride introducing relatively low residual stress, with the thickness of each layer close to each crystallite size, it is possible to provide a piston ring with a hard laminate coating having improved hardness and thermal conductivity, the optimized residual stress, as well as excellent scuffing resistance, wear resistance and peeling resistance.

Thus, the piston ring of the present invention has a hard coating as thick as 10-60 μm on an outer peripheral sliding surface thereof, the hard coating being formed by alternately laminating two types or more of layers made of different compounds; and each of the compound layers being made of a nitride of at least one metal selected from the group consisting of Ti, Cr, Zr, V, Hf and Al.

In order that the compound layers have high thermal conductivity, rigidity and strength, they preferably have as high crystallinity as possible. To this end, the thickness of a unit laminate, which is a sum of the thickness of each different-type layer in the laminated compound layers, is preferably 20-100 nm, and 1-3 times a sum of the crystallite size of each compound layer.

The compound layers are preferably made of CrN-type chromium nitride and TiN-type titanium nitride. In this case, the hard coating preferably has hardness Hv of 1150 or more, and residual compression stress of 1500 MPa or less.

The thickness of a unit laminate is more preferably 1-1.3 times a sum of the crystallite size of each compound layer.

In an atomic ratio of chromium to titanium in the hard coating, a ratio of titanium is preferably high for thermal conductivity, and a ratio of chromium is preferably high for corrosion resistance. For well-balanced thermal conductivity and corrosion resistance, the atomic ratio of chromium to titanium is preferably in a range of 3/7 to 7/3.

With respect to the crystal orientations of the chromium nitride layer and the titanium nitride layer, a surface of the hard coating preferably has the maximum X-ray diffraction intensity in a (200) plane of CrN in the chromium nitride layer, and in a (200) plane of TiN in the titanium nitride layer.

DESCRIPTION OF THE PREFERRED EMBODIMENTS

Figure 1:
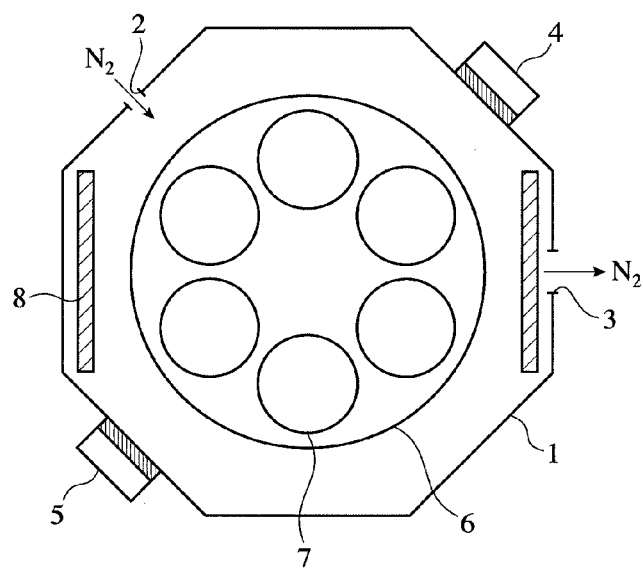
FIG. 1 is a schematic view showing an arc ion plating apparatus used in the present invention.

The piston ring of the present invention is provided with a hard coating as thick as 10-60 μm on an outer peripheral sliding surface thereof, the hard coating being formed by alternately laminating two types or more of layers made of different compounds, and each of the compound layers being made of nitride of at least one metal selected from the group consisting of Ti, Cr, Zr, V, Hf and Al. Nitrides may be TiN, CrN, ZrN, VN, HfN, AlN, TiAlN, etc. The laminate coating is preferably CrN/TiN, CrN/AlN, TiN/AlN, TiN/ZrN, CrN/ZrN, CrN/TiAlN, etc.

According to Non-Patent Reference 1, for example, CrN and TiN formed by arc ion plating have thermal conductivities of 0.0261-0.0307 cal/cm·sec·deg (10.9-12.9 W/m·K in an SI unit) and 0.07 cal/cm·sec·deg (29.3 W/m·K in an SI unit), respectively, the thermal conductivity of TiN being about 2.5 times as high as that of CrN. According to Non-Patent Reference 2, they have Young's moduli of 430 GPa and 550 GPa, respectively, the Young's modulus of TiN being about 1.3 times as high as that of CrN. Thus, a CrN/TiN laminate coating has higher thermal conductivity and Young's modulus than those of a CrN coating. The term "CrN-type chromium nitride" means that the chromium nitride is mainly a CrN type, though it may contain $Cr_2N$-type chromium nitride. The term "TiN-type titanium nitride" means that the titanium nitride is mainly a TiN type, though it may contain $Ti_2N$-type titanium nitride. Because other nitrides than TiN, such as ZrN, VN, HfN, AlN and TiAlN have thermal conductivities equal to or higher than that of CrN, the hard laminate coating of the present invention has higher thermal conductivity than that of the conventional hard CrN coating.

The thickness of a unit laminate is a sum of the thickness of each different-type layer in the laminated compound layers. In the case of a CrN/TiN laminate coating, for example, it is a sum of the thickness of one CrN layer and the thickness of one TiN layer. The thickness of a unit laminate is preferably 20-100 nm. When the thickness of a unit laminate is less than 20 nm, a growing speed of the coating should be low, resulting in undesirably low productivity in forming a hard coating as thick as 10-60 μm, particularly more than 40 μm, on the piston ring of the present invention. On the other hand, when the thickness of a unit laminate is more than 100 nm, crystal grain boundaries and defects such as pores likely increase due to a high growing speed of the coating. Accordingly, the thickness of a unit laminate is preferably 100 nm or less. From the aspect of the propagation of cracking, the thickness of a unit laminate is preferably 20-80 nm, more preferably 20-60 nm.

In the case of the CrN/TiN laminate coating, the hardness Hv of the coating is preferably 1150 or more. When the coating has hardness Hv of less than 1150, cracking undesirably occurs vertically to the coating surface. On the high hardness side, the hardness Hv is preferably 1450 or less.

When the residual stress of the CrN/TiN laminate coating exceeds 1500 MPa as compression stress, the coating is more easily peeled. Accordingly, the residual stress is preferably 1500 MPa or less. Because lower residual compression stress provides the coating with lower hardness, the coating preferably has residual compression stress of at least 300 MPa.

Explanations will be made below specifically on a CrN/TiN laminate coating as a typical example of the present invention, including CrN/ZrN, CrN/TiAlN, CrN/AlN, and TiN/AlN.

When cracking or chipping occurs in a hard coating formed on a piston ring by arc ion plating, cracks generated from defects on or in the coating propagate by tensile stress on the outermost surface of the coating or shear stress inside the coating, which are caused by sliding, so that the coating is finally broken by chipping, detaching, or peeling. Residual compression stress in the CrN/TiN laminate coating reduces tensile stress and shear stress due to friction, thereby suppressing the propagation of cracking. TiN layers having high rigidity (Young's modulus) in the laminate stop cracking vertical to the coating surface.

In the laminate coating of different phases, which generally has strain along interfaces of different phases, cracks likely propagate along the interfaces. However, because nitrides of elements selected from Ti, Cr, Zr, V, Hf and Al (TiN, CrN, ZrN, VN, RN and MN) have close lattice constants, strong interfaces with high conformity are formed in their laminate coatings. Particularly, because CrN and TiN have extremely close lattice constants of 0.414 nm and 0.424 nm, respectively, strong interfaces are formed in a CrN/TiN laminate coating. When the thicknesses of a CrN layer and the thicknesses of a TiN layer are respectively equal to the crystallite size of CrN and the crystallite size of TiN, the CrN/TiN laminate coating may be regarded as a single crystal at least in a thickness direction, exhibiting much higher rigidity than polycrystals. The coating may be considered as being composed of polycrystals having boundaries with small inclination to the coating surface. This structure suppresses the propagation of cracking on and in the laminate coating. The thickness of a unit laminate composed of a CrN layer and a TiN layer is preferably 20-100 nm, and in a range of 1-1.3 times a sum of the crystallite sizes of CrN and TiN.

When the thickness of the CrN layer and the thickness of the TiN layer are respectively close to the crystallite size of CrN and the crystallite size of TiN, respectively, phonon scattering in crystal grain boundaries is reduced, resulting in higher thermal conductivity. Accordingly, the thickness of a unit laminate is preferably 20-100 nm, and in a range of 1-1.3 times a sum of the crystallite sizes of CrN and TiN, from the aspect of strength and thermal conductivity. Needless to say, the solid solution of a third element (carbon) as described in Reference 4 is undesirable, because of thermal conductivity reduced by phonon scattering.

Because TiN has thermal conductivity about 2.5 times as high as that of CrN as described above, the lamination of TiN increases the thermal conductivity of the entire coating. However, TiN is poorer in corrosion resistance than CrN. Accordingly, the ratio of titanium is preferably high for thermal conductivity, and the ratio of chromium is preferably high for corrosion resistance. From the aspect of their balance, it is further preferably in a range of 3/7 to 7/3.

The growth directions of the CrN layer and the TiN layer to be laminated are different depending on the film-forming conditions. Though not restrictive, the CrN layer preferably has the maximum diffraction intensity in a (200) plane, and the TiN layer preferably has the maximum diffraction intensity in a (200) plane.

A metal layer may be formed between the laminate coating and the substrate to improve their adhesion.

In the present invention, the CrN/TiN laminate coating is formed by an arc ion plating apparatus schematically shown in the plan view of FIG. 1. This arc ion plating apparatus comprises a vacuum chamber 1 having a gas inlet 2 and a gas outlet 3, a rotary table 6 on which articles 7 (stacked piston rings) are placed, and a metallic Cr cathode (target) 4 and a metallic Ti cathode (target) 5 arranged as evaporation sources at opposing positions via the rotary table 6. The articles 7 per se are rotated on the rotary table 6. The evaporation sources 4, 5 are connected to anodes (not shown) of an arc power supply, and the rotary table 6 is connected to a bias power supply (not shown). A heater 8 is arranged on a wall of the apparatus.

In an arc ion plating method, with a nitrogen ($N_2$) gas introduced into the vacuum chamber 1, arc is generated on the metallic Cr cathode and/or the metallic Ti cathode as evaporation sources to instantaneously melt metallic Cr and/or Ti, thereby ionizing them in a nitrogen plasma; and chromium ions, titanium ions, or CrN or TiN formed by reaction with nitrogen plasma are attracted to the articles 7 to which negative bias voltage is applied, thereby forming thin films. In the arc ion plating, high ionization ratios of metallic Cr and Ti are achieved by a high energy density, resulting in a high film-forming speed, which enables the industrial formation of coatings as thick as 10-60 μm required for piston rings.

Though the CrN/TiN laminate coating may be obtained by alternately forming CrN and TiN by alternate discharge of the metallic Cr cathode and the metallic Ti cathode, the discharge of the metallic Cr cathode and the discharge of the metallic Ti cathode are carried out preferably simultaneously to increase the film-forming speed and thus productivity. Because the amounts of Cr and Ti evaporated from the metallic Cr cathode and the metallic Ti cathode and a partial pressure of a nitrogen gas determine the compositions of chromium nitride and titanium nitride, they are adjusted in the present invention, such that the resultant coating is based on CrN-type chromium nitride and TiN-type titanium nitride. Because the amounts of metals evaporated from the evaporation sources depend on their intrinsic vapor pressures at melting points and arc current (temperature), the ratio of Cr to Ti can be adjusted by changing arc current within such a range as not to change the composition (for example, from a CrN-based composition to a $Cr_2N$-based composition). Thus, the thickness of each CrN layer and each TiN layer can be controlled by arc current and the rotation speed of the rotary table 6. The thickness of the CrN layer and the TiN layer can be directly measured by a field emission scanning electron microscope (FE-SEM), etc., and the thickness of a unit laminate of one CrN layer and one TiN layer, which is formed during one rotation of the rotary table, is a value obtained by dividing the film-forming speed (μm/min) by the rotation speed (rpm) of the table. Because a higher film-forming speed is obtained by higher arc current, higher arc current or a higher rotation speed of the table provides a unit laminate with smaller thickness.

In general, the crystal structure of the coating formed by arc ion plating can be controlled by pressure in the furnace and bias voltage. High pressure in the furnace and low bias voltage provide columnar crystals, and low pressure in the furnace and high bias voltage provide granular structure. However, this is not always true, as Patent Reference 2 teaches that high bias voltage provides columnar crystals. A film-forming ion plating environment is extremely complicated. For example, the same structure would not necessarily be obtained with the same arc current, furnace pressure and bias voltage, if the apparatus were changed. Of course, the arrangements of articles, evaporation sources, etc. in the furnace have relatively large influence on the structure, in addition to substrate materials, crystal structures, temperatures, surface conditions, etc. Thus, the film-forming conditions should be set depending on the apparatus.

Example 1

Piston rings each having a rectangular cross section and a barrel-faced outer peripheral surface [nominal diameter (d): 96 mm, thickness (al): 3.8 mm, and width (h1): 2.5 mm] were formed from a wire of SWOSC-V, and 50 piston rings were stacked, shot-blasted on their outer peripheral surfaces to surface roughness (Ry) of several μm, and set in an arc ion plating apparatus (AIP-S40 available from Kobe Steel, Ltd.), which had a target of 99.9-%-pure metallic chromium and a target of 99.9-%-pure metallic titanium. After evacuating the apparatus to $1.0 \times 10^{-2}$ Pa, outer peripheral surfaces of the piston rings as substrates were cleaned by a bombardment treatment, with an Ar gas introduced up to 1.0 Pa, and bias voltage of −600 V to −1000 V applied. The Ar gas was 99.99% pure. Thereafter, with a 99.999-%-pure $N_2$ gas introduced up to 4 Pa, ion plating was conducted for 400 minutes, at arc current of 120 A for the metallic chromium cathode, arc current of 170 A for the metallic titanium cathode, bias voltage of −9 V, and a table-rotating speed of 2 rpm. To improve adhesion, a metallic Cr layer was formed between the substrate and the laminate coating. The resultant piston rings each having a CrN/TiN laminate coating were measured as described below.

[1] Measurement of Thickness

Figure 2:
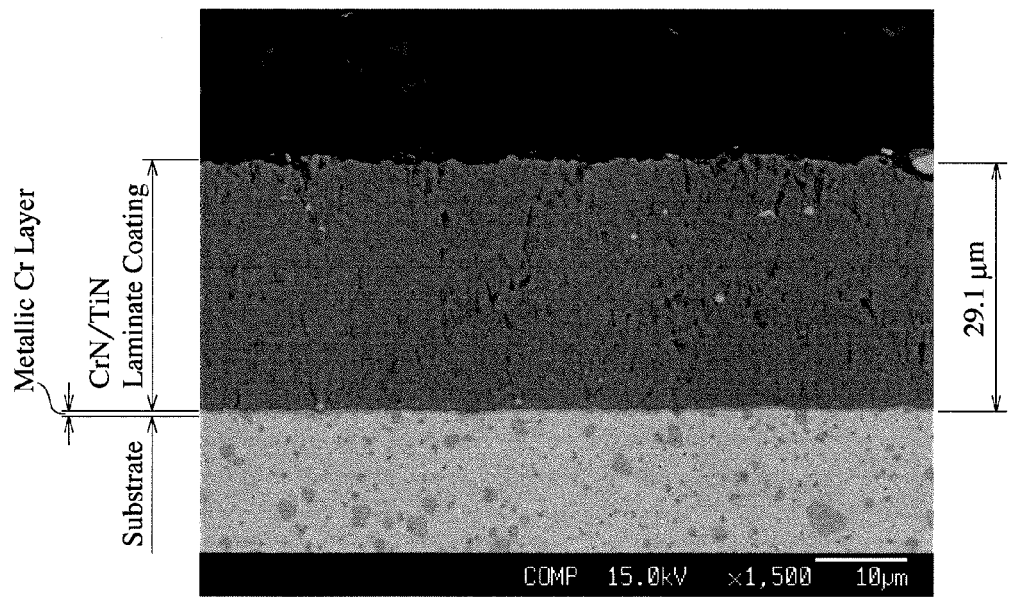
FIG. 2 is a scanning electron photomicrograph showing a cross section of the piston ring of Example 1 having a CrN/TiN laminate coating.

The thickness of a coating was determined by measuring the distance from the coating surface to the substrate surface on a scanning electron photomicrograph (SEM photograph) of a cross section of a mirror-polished piston ring perpendicular to the coating surface. FIG. 2 shows a SEM photograph. The thickness of the coating was 29.1 μm in Example 1. The dark gray coating slightly contained metallic Cr droplets (bright white). The thickness of a unit laminate (a chromium nitride layer+a titanium nitride layer) formed during one rotation of the rotary table was calculated as 0.0364 μm (36.4 nm), from the above thickness of 29.1 μm, the coating time of 400 minutes, and the number of table rotation of 2 rpm.

[2] Measurement of Hardness

Using a micro-Vickers hardness meter, the hardness of a mirror-polished coating surface was measured at a test force of 0.9807 N. The CrN/TiN laminate coating of Example 1 had hardness Hv of 1290.

[3] Measurement of Residual Stress

The residual stress a of the coating was calculated by the following Stoney' formula:

$$\sigma = -[E_s(1-v_s)h_s^2]/6h_f \Delta R \qquad (1),$$

wherein $E_s$ is the Young's modulus (N/mm$^2$) of the substrate, $v_s$ is the Poisson's ratio of the substrate, $h_s$ is the thickness of the substrate, $h_f$ is the thickness of the coating, and $\Delta R$ is a curvature change. $E_s$ and $v_s$ were 200,000 N/mm$^2$ and 0.3, respectively. The residual stress in Example 1 was −843 MPa (843 MPa as a compression stress).

[4] Measurement of X-Ray Diffraction

Figure 3:
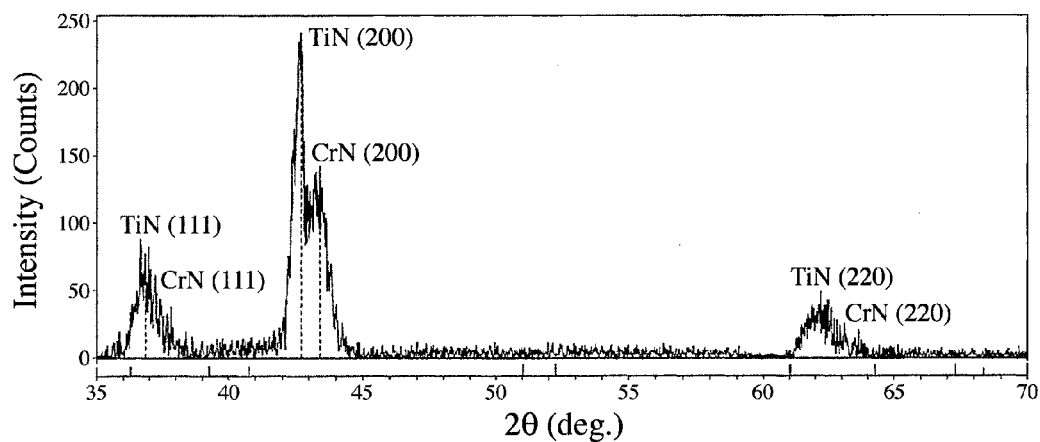
FIG. 3 is a view showing an X-ray diffraction pattern in Example 1.

The X-ray diffraction intensity of a mirror-polished coating surface was measured in a 2θ range of 35-70°, using Cu-Kα rays at a tube voltage of 40 kV and a tube current of 30 mA. As shown in FIG. 3, the X-ray diffraction pattern of Example 1 exhibited diffraction peak intensities, which was maximum in a (200) plane of TiN, followed by a (200) plane of CrN and a (111) plane of TiN. The crystallite sizes $D_{hkl}$ in a (200) plane of TiN and a (200) plane of CrN were calculated by the following Scherrer equation.

$$D_{hkl}=K\lambda/\beta \cos \theta \quad (2),$$

wherein K is a Scherrer constant of 0.94, λ is a wavelength of X rays (Cu: 1.5406 Å), δ is a full width at half maximum (FWHM), and θ is a Bragg angle. In Example 1, the CrN layer had a crystallite size of 9.0 nm, and the TiN layer had a crystallite size of 22.9 nm, so that a sum of the crystallite sizes of a CrN layer and a TiN layer was 31.9 nm. The thickness of a unit laminate calculated from the coating thickness was 36.4 nm, 1.14 times a sum of the crystallite sizes of chromium nitride and titanium nitride.

[5] Measurement of Coating Composition

The composition of the coating was analyzed by an electron probe micro analyzer (EPMA). The atomic ratio of Cr/Ti/N was 16.5/29.3/54.2, and the atomic ratio of Cr to Ti was 3.6/6.4.

[6] Rolling Contact Fatigue Test

Figure 4:
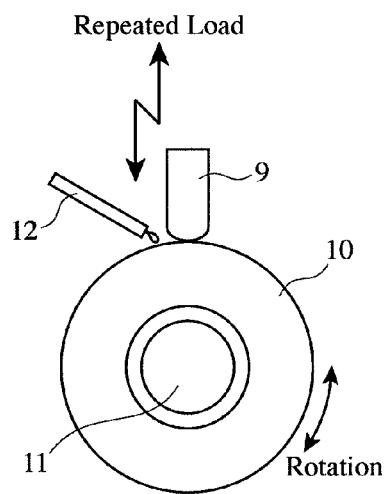
FIG. 4 is a schematic view showing a rolling contact fatigue test machine.

A rolling contact fatigue test was conducted to evaluate the peeling of the coating in an actual engine test. In the rolling contact fatigue test using a test machine schematically shown in FIG. 4, a load was repeatedly applied to a test piece 9 sliding on a rotating drum 10 to cause the peeling of the coating in a relatively short period of time. The detachment of the coating depends on a friction coefficient, a load (maximum Hertz stress), and the repetition number of load application under the same lubrication conditions. The test conditions were as follows:

| | |
|---|---|
| Test piece | Cut piston ring piece having a CrN/TiN laminate coating, |
| Load | 98-196 N with a sine curve of 50 Hz, |
| Mating member | Drum of SUJ2 having a diameter of 80 mm, |
| Sliding speed | Reciprocal sliding at a speed of ±2 m/second for 10 seconds, |
| Acceleration | 0.08 m/second², |
| Lubricant | 4 cc/min of pure water, |
| Temperature | 80° C. on a drum surface, and |
| Test time | 1 hour. |

The test results were evaluated by whether or not the coating was detached. As a result of the rolling contact fatigue test in Example 1, the coating was not detached.

Examples 2-8

In Examples 2-8, ion plating was conducted under the film-forming conditions shown in Table 1, which also shows the film-forming conditions in Example 1. In Example 2, a lower partial pressure of N₂ than in Example 1 was used. In Example 3, a ratio of chromium to titanium was changed by changing arc current applied to the metallic chromium cathode and the metallic titanium cathode, and larger bias voltage than in Example 1 was used. In Examples 4 and 5, the number of rotation of the table was smaller than in Example 1 to change the thickness of a unit laminate. In Example 6, arc current applied to the metallic chromium cathode and the bias voltage were larger than in Example 4.

In Example 7, the bias voltage was larger than in Examples 3 and 6. In Example 8, the bias voltage was smaller than in Example 3.

TABLE 1

| No. | Arc Current (A) Cr | Arc Current (A) Ti | Partial Pressure of N₂ (Pa) | Bias Voltage (V) | Rotation of Table (rpm) | Film-Forming Time (minute) |
|---|---|---|---|---|---|---|
| Example 1 | 120 | 170 | 4 | −9 | 2 | 400 |
| Example 2 | 120 | 170 | 2.7 | −9 | 2 | 370 |
| Example 3 | 160 | 130 | 4 | −12 | 2 | 330 |
| Example 4 | 120 | 170 | 4 | −9 | 1 | 400 |
| Example 5 | 120 | 170 | 4 | −9 | 0.5 | 400 |
| Example 6 | 160 | 170 | 4 | −12 | 1 | 400 |
| Example 7 | 120 | 170 | 4 | −15 | 2 | 400 |
| Example 8 | 160 | 130 | 4 | −9 | 2 | 350 |

The X-ray diffraction measurement results are shown in Table 2, and the coating composition measurement results by EPMA are shown in Table 3. In all Examples and Comparative Examples, the coating was constituted by CrN-type chromium nitride and TiN-type titanium nitride, the chromium nitride exhibiting the maximum peak in a (200) plane of CrN, and the titanium nitride exhibiting the maximum peak in a (200) plane of TiN. In Examples, the crystallite size was 9-40.3 nm in CrN, and 12.4-51.4 nm in TiN, and a sum of the crystallite sizes of CrN and TiN was 30.5-91 nm. With respect to the coating composition, about 5 atomic % of excessive N was measured, with an atomic ratio of Cr to Ti in a range of 3.6/6.4 to 5.5/4.5.

TABLE 2

| No. | Structure of Coating Crystal Phase | Structure of Coating Maximum Peak Plane[1] | Crystallite Size (nm) CrN | Crystallite Size (nm) TiN | Sum (S) |
|---|---|---|---|---|---|
| Example 1 | CrN, TiN | TiN (200) | 9 | 22.9 | 31.9 |
| Example 2 | CrN, TiN | CrN (200) | 15.7 | 15.5 | 31.2 |
| Example 3 | CrN, TiN | CrN (200) | 18.2 | 12.4 | 30.6 |
| Example 4 | CrN, TiN | TiN (200) | 21.2 | 45.2 | 66.4 |
| Example 5 | CrN, TiN | TiN (200) | 39.6 | 51.4 | 91 |
| Example 6 | CrN, TiN | TiN (200) | 40.3 | 43.2 | 83.5 |
| Example 7 | CrN, TiN | TiN (200) | 11.6 | 18.9 | 30.5 |
| Example 8 | CrN, TiN | CrN (200) | 19.6 | 12.5 | 31.1 |

[1]A plane exhibiting the maximum peak in X-ray diffraction.

TABLE 3

| No. | Composition of Coating (atomic %) Cr | Ti | N | Cr/Ti |
|---|---|---|---|---|
| Example 1 | 16.5 | 29.3 | 54.2 | 3.6/6.4 |
| Example 2 | 22.6 | 22.2 | 55.2 | 5/5 |
| Example 3 | 23.3 | 22.6 | 54.1 | 5.1/4.9 |
| Example 4 | 30.9 | 16.3 | 52.8 | 6.5/3.5 |
| Example 5 | 22.5 | 22.3 | 55.2 | 5/5 |
| Example 6 | 14.5 | 29.4 | 56.1 | 3.3/6.7 |
| Example 7 | 17.3 | 28 | 54.7 | 3.8/6.2 |
| Example 8 | 25.3 | 20.3 | 54.4 | 5.5/4.5 |

With respect to each coating, the measurement results of thickness, hardness and residual compression stress, as well as the rolling contact fatigue test results are shown in Table 4. The coatings were as thick as 25.2-38.5 μm. With this value of thickness, the thickness of a unit laminate was calculated as 33-140 nm from the number of rotation of the table and the film-forming time. A ratio of the thickness of a unit laminate to a sum of the crystallite sizes of CrN and TiN determined by the X-ray diffraction measurement, which is shown in Table 2, was 1.08-1.54. The coatings had hardness Hv of 1074-1553, and residual stress of −505 MPa to −2024 MPa ("−" means compression). In the rolling contact fatigue test, the coatings of Examples 1-4 and 6 were not detached, though the coating of Example 5 was slightly detached. The coating of Example 7 was detached, and the coating of Example 8 was cracked on the surface.

TABLE 4

| No. | Coating Thickness (μm) | Unit Laminate[1] (nm) | T/S[2] | Hardness (Hv) | Residual Stress (MPa) | Detachment or Surface Cracking[3] |
|---|---|---|---|---|---|---|
| Example 1 | 29.1 | 36.4 | 1.14 | 1290 | −843 | No |
| Example 2 | 26.2 | 35.5 | 1.14 | 1265 | −1376 | No |
| Example 3 | 25.2 | 38.2 | 1.25 | 1317 | −749 | No |
| Example 4 | 30.4 | 76.0 | 1.14 | 1423 | −712 | No |
| Example 5 | 28.0 | 140.0 | 1.54 | 1426 | −505 | Slightly Detached |
| Example 6 | 38.5 | 96.3 | 1.15 | 1380 | −666 | No |
| Example 7 | 26.4 | 33.0 | 1.08 | 1553 | −2024 | Yes |
| Example 8 | 27.2 | 38.9 | 1.25 | 1074 | −556 | Surface-Cracked |

Note:
[1]The thickness T of a unit laminate.
[2]T/S is a ratio of the thickness of a unit laminate to a sum of the crystallite sizes.
[3]The detachment or surface cracking of the coating by the rolling contact fatigue test.

Comparative Examples 1 and 2

In Comparative Examples 1 and 2, commercially available piston rings having a CrN coating and a TiN coating, respectively, in place of the CrN/TiN laminate coating were measured with respect to thickness, hardness, residual stress, and X-ray diffraction, and subjected to a rolling contact fatigue test. The results are shown in Table 5. Comparative Example 1 had a coating having excellent chipping resistance with relatively high porosity and as low hardness Hv as 950, and Comparative Example 2 had a coating having relatively high hardness. Both coatings were detached under severe conditions in the rolling contact fatigue test.

TABLE 5

| No. | Coating Thickness (μm) | Crystallite Size (nm) | Maximum Peak Plane[1] | Hardness (Hv) | Residual Stress (MPa) | Detachment or Surface Cracking[2] |
|---|---|---|---|---|---|---|
| Comp. Ex. 1 | 38 | 39.5 | CrN (200) | 950 | −459 | Yes |
| Comp. Ex. 2 | 26 | 32.5 | TiN (111) | 1559 | −769 | Yes |

[1]A plane exhibiting the maximum peak in X-ray diffraction.
[2]The detachment or surface cracking of a coating by the rolling contact fatigue test.

Examples 9-10

Ion plating was conducted in the same manner as in Example 1, except for changing the arc-ion-plating cathodes to the same metallic chromium cathode as in Example 1 and a 99.7-%-pure metallic zirconium cathode (Example 9), and to the same metallic chromium cathode as in Example 1 and a titanium-aluminum alloy (50 atomic % Ti-50 atomic % Al alloy) cathode (Example 10), thereby forming a CrN/ZrN laminate coating in Example 9 and a CrN/TiAlN laminate coating in Example 10 on piston rings. The arc current was 120 A at the metallic chromium cathode, 170 A at the metallic zirconium cathode, and 170 A at the titanium-aluminum cathode.

Examples 11-12

Ion plating was conducted in the same manner as in Example 2, except for changing the arc ion plating cathodes and the arc current, to form a CrN/AlN laminate coating (Example 11) and a TiN/AlN laminate coating on piston rings (Example 12). The cathodes used in Example 11 were the same metallic chromium cathode as in Example 2, and a 99.9-%-pure metallic aluminum cathode. The cathodes used in Example 12 are the same metallic titanium cathode as in Example 2, and a 99.9-%-pure metallic aluminum cathode. The arc current was 200 A at the metallic chromium cathode, 200 A at the metallic titanium cathode, and 105 A at the metallic aluminum cathode.

The X-ray diffraction measurement results in Examples 9-12 are shown in Table 6. The coatings were constituted by a CrN phase and a ZrN phase, a CrN phase and a TiAlN phase, a CrN phase and an AlN phase, and a TiN phase and an AlN phase, respectively. The maximum peaks were obtained in a (200) plane of ZrN, a (200) plane of TiAlN, a (200) plane of CrN, and a (200) plane of TiN. The crystallite size was 10.1-24.8 nm, and a sum of the crystallite sizes was 28.4-44.9 nm.

TABLE 6

| No. | Coating Structure Crystal Phase | Maximum Peak Plane[1] | Crystallite Size (nm) CrN or TiN | ZrN, TiAlN or AlN | Sum (S) |
|---|---|---|---|---|---|
| Example 7 | CrN, ZrN | ZrN (200) | 10.1 | 21.4 | 31.5 |
| Example 8 | CrN, TiAlN | TiAlN (200) | 12.9 | 16.5 | 28.4 |

TABLE 6-continued

| | Coating Structure | | Crystallite Size (nm) | | |
|---|---|---|---|---|---|
| No. | Crystal Phase | Maximum Peak Plane[(1)] | CrN or TiN | ZrN, TiAlN or AlN | Sum (S) |
| Example 9 | CrN, AlN | CrN (200) | 22.5 | 19.8 | 42.3 |
| Example 10 | TiN, AlN | TiN (200) | 24.8 | 20.1 | 44.9 |

[(1)]A plane exhibiting the maximum peak in X-ray diffraction.

With respect to each coating, the measurement results of thickness, hardness and residual compression stress, as well as the rolling contact fatigue test results are shown in Table 7. The coatings were as thick as 28.5-35.5 μm. With this value of thickness, the thickness of a unit laminate was calculated as 35.6-48.0 nm from the number of rotation of the table and the film-forming time. A ratio of the thickness of a unit laminate to a sum of the crystallite sizes determined by the X-ray diffraction measurement, which is shown in Table 6, was 1.04-1.29. The coatings had hardness Hv of 1159-1394, and residual stress of −576 MPa to −977 MPa. In the rolling fatigue test, the coatings did not suffer detachment and surface cracking.

TABLE 7

| | Coating | | | | |
|---|---|---|---|---|---|
| No. | Thickness (μm) | Unit Laminate[(1)] (nm) | T/S[(2)] | Hardness (Hv) | Residual Stress (MPa) | Detachment or Surface Cracking[(3)] |
| Example 9 | 28.5 | 35.6 | 1.13 | 1319 | −977 | No |
| Example 10 | 29.2 | 36.5 | 1.29 | 1394 | −867 | No |
| Example 11 | 32.5 | 43.9 | 1.04 | 1159 | −576 | No |
| Example 12 | 35.5 | 48.0 | 1.07 | 1218 | −697 | No |

Note:
[(1)]The thickness T of a unit laminate.
[(2)]T/S is a ratio of the thickness of a unit laminate to a sum of the crystallite sizes.
[(3)]The detachment or surface cracking of the coating by the rolling contact fatigue test.

Effects of the Invention

Because the piston ring having a hard laminate coating for excellent scuffing resistance, wear resistance and peeling resistance according to the present invention is provided with laminated compound layers having high thermal conductivity, it exhibits higher thermal conductivity necessary for piston rings than those of conventional hard CrN-coated piston rings. High thermal conductivity contributes to permitting heat to efficiently escape from a piston head to a cooled cylinder wall, resulting in decreased thermal stress, thereby suppressing cracking and chipping.

As compared with piston rings having hard coatings such as TiN, etc. having such high Young's modulus and residual stress that the coatings suffer peeling when made thicker, the laminate coating comprising compound layers having relatively low Young's modulus, which act as stress-relaxing layers, suppresses the generation and/or propagation of cracks, thereby exhibiting high peeling resistance. Further, by making the thickness of a unit laminate close to a sum of the crystallite sizes of compound layers, in addition to laminating compounds having high Young's modulus, the laminated compound layers are provided with high crystallinity (high rigidity), thereby exhibiting high resistance to propagation of cracking. Of course, higher crystallinity provides higher thermal conductivity.

Thus, the piston ring having a hard coating obtained by laminating layers made of different compounds has a well-balanced residual compression stress, thereby exhibiting excellent scuffing resistance, wear resistance and peeling resistance, so that it can be used in various severe environments.

What is claimed is:

1. A piston ring having a hard coating as thick as 10-60 μm on an outer peripheral sliding surface thereof,
   said hard coating being formed by alternately laminating at least two kinds of layers;
   each of said at least two kinds of layers comprising a metallic nitride,
   each metal of the metallic nitride is selected from the group consisting of Ti, Cr, Zr, V, Hf and Al so that the selected metals of the metallic nitrides are different from each other; and
   said hard coating having hardness of 1159 Hv or more and 1423 Hv or less, wherein
   said hardness is measured at a test force of 0.9807 N.

2. The piston ring according to claim 1, wherein the thickness of a unit laminate, which is a sum of the thickness of each different-type layer in the laminated compound layers, is 20-100 nm.

3. The piston ring according to claim 1, wherein the thickness of a unit laminate is 1-3 times a sum of the crystallite size of each compound layer.

4. The piston ring according to claim 1, wherein said compound layers are made of CrN-type chromium nitride and TiN-type titanium nitride, respectively; and wherein said hard coating has a residual compression stress of 1500 MPa or less.

5. The piston ring according to claim 4, wherein the thickness of a unit laminate is 1-1.3 times a sum of the crystallite size of each compound layer.

6. The piston ring according to claim 4, wherein an atomic ratio of chromium to titanium in said hard coating is 3/7 to 7/3.

7. The piston ring according to claim 4, wherein a surface of said hard coating has the maximum X-ray diffraction intensity in a (200) plane of CrN in the chromium nitride layer, and in a (200) plane of TiN in the titanium nitride layer.

* * * * *